United States Patent [19]
Ito et al.

[11] 3,832,656
[45] Aug. 27, 1974

[54] TUNING CIRCUIT WHEREIN VARIATION OF TRANSISTOR BASE BIAS CAUSES VARIATION OF RESONANCE FREQUENCY

[75] Inventors: Tamotsu Ito; Shin-Ichi Ohashi, both of Toyokawa; Yasuji Miyake, Nagoya, all of Japan

[73] Assignee: Hitachi, Ltd., Tokyo, Japan

[22] Filed: Nov. 9, 1973

[21] Appl. No.: 414,303

[30] Foreign Application Priority Data
Nov. 10, 1972 Japan .......................... 47/112754

[52] U.S. Cl. ................ 334/14, 307/295, 331/117 R
[51] Int. Cl. ........................... H03j 3/18, H03b 5/12
[58] Field of Search ................ 334/11, 14; 328/223; 331/108 D, 117 R, 167; 307/295

[56] References Cited
UNITED STATES PATENTS
3,717,826 2/1973 Legler ............................ 331/117 R
3,763,439 10/1973 Peil ............................ 331/108 D X

*Primary Examiner*—Paul L. Gensler
*Attorney, Agent, or Firm*—Craig & Antonelli

[57] ABSTRACT

A tuning circuit comprising a first impedance element including a capacitor or inductor and connected between the emitter and collector of a first common-base connection transistor, and a second impedance element inserted between the collector of the first transistor and a power supply for constituting a resonance circuit in combination with the first impedance element, the emitter of the first transistor being grounded through a resistor and the resonance frequency of the resonance circuit being changed by varying the base bias voltage of the first transistor, wherein the emitter of a newly added second common-base connection transistor is connected to the emitter of the first transistor so that the two transistors provide a DC type differential amplifier.

6 Claims, 3 Drawing Figures

PATENTED AUG 27 1974 3,832,656

TUNING CIRCUIT WHEREIN VARIATION OF TRANSISTOR BASE BIAS CAUSES VARIATION OF RESONANCE FREQUENCY

BACKGROUND OF THE INVENTION

1. Field of the Invention

This invention relates to a tuning circuit for communication equipment and more in particular to an economical tuning circuit adapted for the use as a tuner of the receiver of broadcast signals requiring great frequency variation without using any variable capacitor or variable-capacitance diode.

2. Description of the Prior Art

It is well known that even without any variable capacitor or variable-capacitance diode, the impedance of a combined circuit can be varied by varying the bias of an active element if the active element is used in combination with circuit elements having fixed constants. The present inventors had proposed a tuning circuit in which such an active element combines with circuit elements with fixed constants to constitute a resonance circuit and whose resonance frequency is changed by varying the bias of the active element. Such a tuning circuit comprises a common-base connection transistor with its base grounded through a capacitor of large capacity, a capacitor inserted between the collector and emitter of the transistor, an inductor connected between the collector of the transistor and a power supply, a resistor inserted between the emitter of the transistor and the ground and a resistance type voltage divider including a variable resistor for varying the base bias voltage of the transistor. In order to meet the requirement for a wider range of the tuning frequency of such a tuning circuit, a resistor with a great resistance value must be connected to the emitter of the transistor thereby to increase the ratio of the value of the high frequency current flowing in the emitter of the transistor to that of the high-frequency current flowing in the resistor connected to the emitter. Such a tuning circuit, however, is disadvantageous in that the Q-factor of the tuning circuit is decreased in inverse proportion to the resistance value of the resistor connected to the emitter of the transistor. Another disadvantage of such a tuning circuit is that the value of Q-factor varies with the variation of the bias for changing the tuning frequency.

SUMMARY OF THE INVENTION

An object of the invention is to provide a tuning circuit which permits a wide range of frequency variation and whose resonance frequency can be varied by merely varying the DC voltage.

Another object of the invention is to provide a tuning circuit which has a high Q-factor and is stable in its operation.

Still another object of the invention is to provide a tuning circuit adapted for the use as a tuner requiring a wide range of receiving frequencies incorporated in such a device as a receiver for radio broadcast signals.

In order to achieve the above-mentioned objects, the tuning circuit according to the invention comprises a first common-base connection transistor, a first impedance element connected between the emitter and collector of the first common-base connection transistor, a second impedance element connected between the collector of the first common-base connection transistor and a power supply and having reactance opposite in phase to the reactance of the first impedance element, the second impedance element being, for example, an inductor if a capacitor is used as the first impedance element, a resistor inserted between the emitter of the first transistor and the ground, a second common-base connection transistor with its emitter connected to the emitter of the first transistor, and means for applying a variable bias to at least one of the bases of the first and second common-base connection transistors.

DESCRIPTION OF THE PREFERRED EMBODIMENTS

Figure 1:
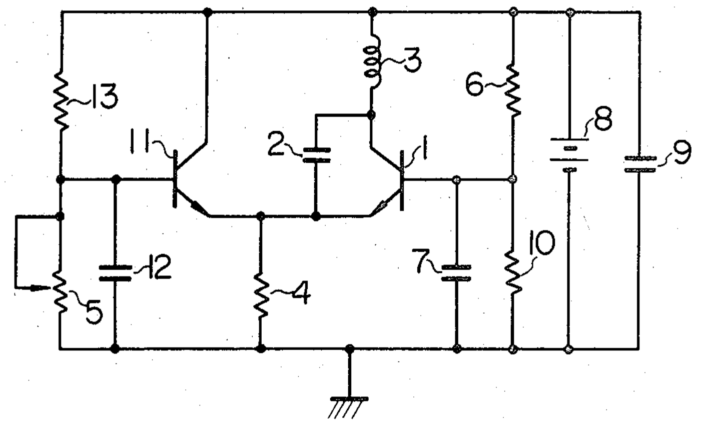
FIGS. 1 to 3 are diagrams showing embodiments of the present invention.

In FIG. 1, reference numerals 1 and 11 show common-base connection transistors, numeral 2 a capacitor, numeral 3 an inductor, numerals 7, 9 and 12 large-capacity capacitors for AC-wise grounding, and numeral 8 a power supply. The base of the transistor 1 is grounded through the large-capacity capacitor 7. The capacitor 2 as to first impedance element is inserted between the emitter and collector of the transistor 1 while the inductor 3 as the second impedance element is inserted between the collector of the transistor 1 and the power supply 8, so that the DC base bias voltage divided by the resistors 6 and 10 is applied to the base of the transistor 1. The emitter of transistor 1 is connected to the emitter of the transistor 11 whose base is grounded through the large-capacity capacitor 12, both the emitters being grounded through the resistor 4. By selecting the value of resistance $R_4$ of the resistor 4 much larger than the input resistance $R_1$ of the transistor 1 as viewed from its emitter and the input resistance $R_2$ of the transistor 11 as viewed from its emitter, DC emitter current $I_0$ flowing in the resistor 4 which is the sum of DC emitter current $I_1$ of the transistor 1 and DC emitter current $I_2$ of the transistor 11 is made stable. As a result, the input resistances $R_1$ and $R_2$ of the transistors 1 and 11 are respectively expressed as follows:

$$R_1 = KT/qI_1 \quad (1)$$

$$R_2 = KT/qI_2 \quad (2)$$

Here, $K$ is Boltzmann's constant, $T$ the absolute temperature and $q$ charge of electrons.

It will be noted from equations 1 and 2 that the value of composite resistance $R_0$ between the emitters and the ground is determined by the DC emitter current $I_0$ flowing in the resistor 4 as will be apparent from the following equation 3.

$$R_0 \approx R_1 \cdot R_2/(R_1 + R_2) = KT/qI_0 \approx 0.026/I_0 \quad 3$$

Since $R_4 >> R_0$, the parallel-connected resistance $R_4$ is negligible.

In the conventional circuit not having the transistor 11, the composite resistance $R_0'$ between the emitters and the ground is expressed as follows:

$$R_0' = R_4 \cdot R_1/(R_4 + R_1) \approx 0.026R_4/(0.026 + I_1R_4) \quad (4)$$

It will be understood from equation 4 that the resistance $R_0'$ varies with DC emitter current $I_1$ of the transistor 1. According to the invention, by contrast, the resistance $R_0$ depends not on the DC emitter current $I_1$ but on the stable current $I_0$ as is apparent from equation 3, with the result that variation of the bias for tuning does not cause any change in Q-factor. Also, it is possible to obtain a high value of Q-factor by increasing the sum $I_0$ of the emitter currents of the transistors 1 and 11.

The resonance frequency $f$ of the tuning circuit shown in FIG. 1 is expressed as follows:

$$f = 1/2\pi \sqrt{(1-AP)\, CL} \quad (5)$$

Here, $C$ is the value of capacitance of the capacitor 2, $L$ the value of inductance of the inductor 3, $A$ the current amplification of the transistor 1 and $P$ a shunt ratio given by the following equation.

$$P \approx I_1/I_0 = R_2/(R_1 + R_2) \quad (6)$$

The adjustment of the variable resistor 5 causes the DC base bias voltage of the transistor 11 to be changed, whereby DC emitter current $I_2$ of the transistor 11 changes. In view of the fact that the DC emitter current $I_0$ in the resistor 4 is constant, DC emitter current $I_1$ of the transistor 1 changes with the result that the resonance frequency expressed by equation 5 which is a function of the shunt ratio P of equation 6 is changed.

Since in the tuning circuit of FIG. 1, the composite resistance of input impedances as viewed from the emitters of the two transistors is small the bases of the transistors are grounded and an output impedance is large, the Q-factor of the resonance circuit can be made high. This circuit arrangement which makes up a feedback amplifier has current amplification factor A always less than unity and its shunt ratio P also less than unity, thus contributing to stable operation. The frequency characteristics of this circuit are such that higher frequencies are realized than the collector-grounded circuit or emitter-grounded circuit, while its phase delay is the least among the circuits. Also, less circuit elements required in the embodiment under consideration makes it very economical. The fact that the resonance frequency can be controlled by DC voltage permits considerable reduction in the quantity of AC wiring involved. With the decrease in DC emitter current $I_2$ of the transistor 11, resonance frequency $f$ changes continuously up to a higher level.

This tuning circuit may be connected to another circuit by way of the emitter or collector of the transistor 1. Further, an arrangement is possible by which a signal applied to the emitter of the transistor 1 is recovered from the collector thereof. This is also the case with the embodiment which will be described below.

Figure 2:
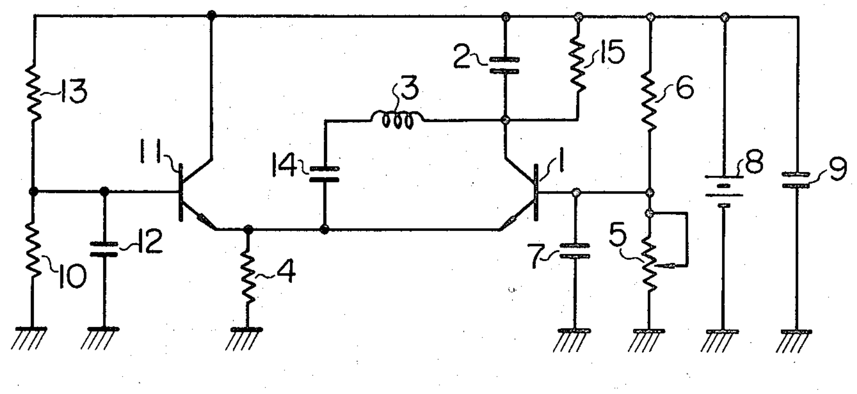

Referring to FIG. 2 showing another embodiment of the invention, the inductor 3 and the capacitor 2 are used as the first and second impedance elements respectively, so that the resonance frequency of the resonance circuit comprising the inductor 3 and the capacitor 2 is changed by changing the DC base bias voltage of the base-grounded circuit portion of the first transistor.

The capacitor 14 is provided for the purpose of DC blocking and has an impedance sufficiently low compared with that of the inductor 3. The impedance value of the resistor 15 is much higher than that of the capacitor 2. The resistor 15 provided for applying a bias voltage to the collector of the transistor 1 may comprise a choke coil.

The circuit of FIG. 2 whose fundamental operation principle is the same as that of the tuning circuit of FIG. 1 is different from the circuit of FIG. 1 in that in the circuit of FIG. 2 the resonance frequency $f$ continuously changes to a lower level with the increase of DC emitter current $I_1$ of the transistor 1 by adjustment of the resistance of the variable resistor 5, that the DC blocking capacitor 14 and the resistor 15 for application of collector voltage are additionally provided, and that the variable resistor 5 for controlling the DC base bias voltage is connected to the base-grounded circuit portion of the first transistor.

Figure 3:
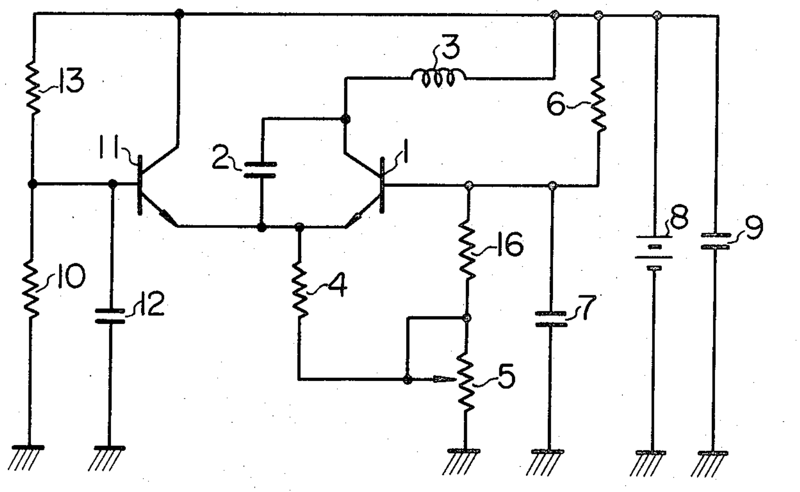

Still another embodiment of the invention is shown in FIG. 3, which is a circuit with a variable resistor 5 inserted between the resistor 4 and the ground in the circuit of FIG. 1. The Q-factor of the resonance circuit comprising the capacitor 2 and the inductor 3 is expressed as follows:

$$Q \alpha \quad 2\pi fL/R_0 \quad (7)$$

This shows that the Q-factor varies with the resonance frequency $f$ even if the resistance value $R_0$ between the emitter and the ground is constant. For this reason, the circuit of FIG. 3 is such an improved one that the resonance frequency $f$ is increased simultaneously with the increase in the resistance $R_0$ thereby to achieve a fixed value of the Q-factor.

It will be needless to say that the present invention can be applied to all the conventional circuits employing variable capacitors, variable-capacitance diodes and variable inductances. In spite of the fact that in the embodiments shown in FIGS. 1 to 3 either the DC base bias voltage of the base-grounded circuit portion of the first transistor or the DC base bias voltage of the base-grounded circuit portion of the second transistor is changed, both of the base bias voltages may be changed at the same time. Alternatively, the base bias voltages may be separately changed by means for coarse adjustment and means for fine adjustment. Further, the resistance value of or the value of current flowing in the resistor 4 may be appropriately changed in an interlocking operation with the base bias voltages thereby to enhance the advantages of the invention.

Though the NPN transistors have been used in the above-described embodiments, PNP type transistors may be employed. Furthermore, the objects of the invention can be achieved also be replacing the resistor 4 by a constant current circuit generally used for a differential amplifier.

We claim:

1. A tuning circuit comprising first and second transistors, the emitters of said first and second transistors being interconnected, a power supply for energizing said first and second transistors, means for grounding AC-wise the bases of said first and second transistors, means for grounding the interconnected emitters of said first and second transistors through a resistor, a first impedance element connected between the collector and emitter of said first transistor, a second impedance element connected between the collector of said first transistor and said power supply for constituting a resonance circuit in combination with said first impedance element, means for applying bias voltages from said power supply to the bases of said first and second transistors, and means for changing the bias voltage applied at least to one of the bases of said first and second transistors to vary the resonance frequency of said resonance circuit.

2. A tuning circuit according to claim 1, wherein said bias voltage changing means comprises means for adjusting coarsely the base bias voltage applied to one of said first and second transistors and means for adjusting finely the base bias voltage applied to the other of said first and second transistors.

3. A tuning circuit comprising first and second transistors, the emitters of said first and second transistors being interconnected, a power supply for energizing said first and second transistors, means for grounding AC-wise the bases of said first and second transistors, means for grounding the interconnected emitters of said first and second transistors through a variable resistor, a first impedance element connected between the collector and emitter of said first transistor, a second impedance element connected between the collector of said first transistor and said power supply for constituting a resonance circuit in combination with said first impedance element, means for applying bias voltages from said power supply to the bases of said first and second transistors, means for changing the bias voltage applied to at least one of the bases of said first and second transistors to vary the resonance frequency of said resonance circuit, and means for changing the resistance value of said variable resistor in an interlocking operation with said bias voltage changing means.

4. A tuning circuit comprising first and second transistors, the emitters of said first and second transistors being interconnected, a power supply for energizing said first and second transistor, means for grounding AC-wise the bases of said first and second transistors, a constant current circuit connected between the interconnected emitters of said first and second transistors and the return path of the power from said power supply, a first impedance element connected between the collector and emitter of said first transistor, a second impedance element connected between the collector of said first transistor and said power supply for constituting a resonance circuit in combination with said first impedance element, means for applying bias voltages from said power supply to the bases of said first and second transistors, and means for changing the bias voltage applied to at least one of the bases of said first and second transistors to vary the resonance frequency of said resonance circuit.

5. A tuning circuit according to claim 4, wherein said bias voltage changing means comprises means for adjusting coarsely the base bias voltage applied to one of said first and second transistors and means for adjusting finely the base bias voltage applied to the other of said first and second transistors.

6. A tuning circuit comprising first and second transistors, the emitters of said first and second transistors being interconnected, a power supply for energizing said first and second transistors, means for grounding AC-wise the bases of said first and second transistors, a constant current circuit connected between the interconnected emitters of said first and second transistors and the return path of the power from said power supply, a first impedance element connected between the collector and emitter of said first transistor, a second impedance element connected between the collector of said first transistor and said power supply for constituting a resonance circuit in combination with said first impedance element, means for applying bias voltages from said power supply to the bases of said first and second transistors, means for changing the bias voltage applied to at least one of the bases of said first and second transistors to vary the resonance frequency of said resonance circuit, and means for changing the current in said constant current circuit in an interlocking operation with said bias voltage changing means to prevent the variation in Q-factor of the tuning circuit due to the variation in the resonance frequency.

* * * * *